(12) United States Patent
Yoon et al.

(10) Patent No.: US 6,462,614 B2
(45) Date of Patent: Oct. 8, 2002

(54) ELECTROTHERMAL INTEGRATOR AND AUDIO FREQUENCY FILTER

(75) Inventors: Euisik Yoon, Taejon (KR); Kwang Hyun Lee, Seoul (KR); Hyung Kew Lee, Kyonggi-do (KR)

(73) Assignee: Korea Advanced Institute of Science & Technology, Taejon (KR)

( * ) Notice: Subject to any disclaimer, the term of this patent is extended or adjusted under 35 U.S.C. 154(b) by 0 days.

(21) Appl. No.: 09/766,839

(22) Filed: Jan. 23, 2001

(65) Prior Publication Data

US 2002/0005752 A1 Jan. 17, 2002

(30) Foreign Application Priority Data

Jul. 14, 2000 (KR) ......................................... 2000-40630

(51) Int. Cl.⁷ ................................................ H03B 1/00
(52) U.S. Cl. ....................... 327/552; 327/558; 327/565; 327/336; 327/342; 327/345
(58) Field of Search ................................. 327/552, 558, 327/557, 565, 336, 342, 345

(56) References Cited

U.S. PATENT DOCUMENTS 5,600,174 A 2/1997 Reay et al. .................. 257/467
6,208,215 B1 * 3/2001 Sauer ........................ 331/108

OTHER PUBLICATIONS

Kwang–Hyun Lee et al., "An Audio Frequency Filter Application of Micromachined Thermally–Isolated Diaphragm Structures", *IEEE the Thirteenth Annual International Conference on MicroElectroMechanical Systems 2000*, 6 pages, (Jan. 24, 2000).

* cited by examiner

Primary Examiner—Margaret R. Wambach
(74) Attorney, Agent, or Firm—Foley & Lardner (57) ABSTRACT

An electrothermal integrator and audio frequency filter utilizing an electrothermal structure fabricated by way of a micro-machining process. An electrothermal structure is a structure in which there is thermal interaction between its electrical components. It is possible to implement an audio frequency filter by properly integrating electrothermal structures fabricated by micro-machining technology and electrical circuitry, because thermal response is generally slower than electrical response. It is possible to implement a variety of filters by way of forming a Gm-C integrator utilizing an electrothermal structure and using this basic block of Gm-C integrator in general circuitry to form filters.

11 Claims, 8 Drawing Sheets

ELECTROTHERMAL INTEGRATOR AND AUDIO FREQUENCY FILTER

BACKGROUND OF THE INVENTION

1. Field of the Invention

The present invention relates to an electrothermal integrator and an audio frequency filter and, more particularly, to an electrothermal integrator and an audio frequency filter having thermally-isolated electrothermal structures.

2. Description of the Prior Art

Electrothermal structures fabricated by micro-machining technology have been employed in a variety of types of sensors. An electrothermal structure is a structure in which there is thermal interaction between its electrical components. As an example of the application of the electrothermal structure, Euisik Yoon et al. proposed a fluid velocity sensor utilizing an electrothermal structure on page 1376 of the IEEE Transaction on Electron Devices (June 1992), and also proposed a RMS-DC converter utilizing a diaphragm structure on page 1666 of the IEEE Transaction on Electron Devices (September 1994). In addition, Richard J. Reay et al. proposed a bandgap reference circuit utilizing an electrothermal structure fabricated by way of electrochemical etching in the International Solid State Circuit Conference of 1995, and obtained U.S. Pat. No. 5,600,174 directed to this technology on Feb. 4, 1997.

Integrated circuit filters typically used switched capacitor filters, or continuous time filters utilizing transconductance amplifier-capacitor ("Gm-C") integrators. However, an audio-frequency low-frequency filter utilizing a Gm-C integrator requires a large capacitor, such that the integration of the capacitor on the chip becomes difficult. In addition, an audio-frequency low-frequency filter utilizing a switched capacitor filter has problems such as switching noise and aliasing.

SUMMARY OF THE INVENTION

Therefore, it is an object of the present invention to provide an electrothermal integrator for audio frequency filters having an insulated electrothermal structure that is fabricated by way of micro-machining technology so that the above problems associated with conventional audio frequency filters can be solved. It is another object of the present invention to provide an audio frequency filter as an application of the insulated electrothermal structure fabricated by micro-machining technology.

To this end, the electrothermal integrator for the audio frequency filter according to an embodiment of the present invention comprises a transconductance amplifier for receiving a first voltage signal and converting the first voltage signal to a current signal, and an electrothermal structure for receiving the current signal output from the transconductance amplifier, converting the current signal to a temperature signal, and converting the temperature signal to a second voltage signal.

Here, the electrothermal structure comprises a substrate having an aperture formed thereon, an insulator layer formed on the substrate and covering an opening of the aperture, a heater formed on the insulator layer over the opening of the aperture, the heater converting the current signal input from the transconductance amplifier to the temperature signal, and a sensor formed on the insulator layer over the opening of the aperture and separated from the heater, the sensor converting the temperature signal of the heater to the second voltage signal.

The electrothermal structure may also be formed by comprising a substrate having a groove formed on a surface thereof, an insulator layer formed on the surface of the substrate, the insulator layer having an extended portion extending over the groove, a heater formed on the extended portion, the heater converting the current signal input from the transconductance amplifier to the temperature signal, and a sensor formed on the extended portion and separated from the heater, the sensor converting the temperature signal of the heater to the second voltage signal.

The audio frequency filter according to a first embodiment of the present invention has an electrothermal structure for converting a first electrical signal received as an input signal to a temperature signal and for converting the temperature signal to a second electrical signal, an input signal processing circuit for inputting the first electrical signal to the electrothermal structure, and an output signal processing circuit for outputting the second electrical signal converted by the electrothermal structure, wherein the electrothermal structure comprises a substrate having an aperture formed thereon, an insulator layer formed on the substrate and covering an opening of the aperture, a heater formed on the insulator layer over the opening of the aperture, the heater converting the first electrical signal input from the input signal processing circuit to the temperature signal, and a sensor formed on the insulator layer over the opening of the aperture and separated from the heater, the sensor converting the temperature signal of the heater to the second electrical signal.

The audio frequency filter according to a second embodiment of the present invention has an electrothermal structure for converting a first electrical signal received as an input signal to a temperature signal and for converting the temperature signal to a second electrical signal, an input signal processing circuit for inputting the first electrical signal to the electrothermal structure, and an output signal processing circuit for outputting the second electrical signal converted by the electrothermal structure, wherein the electrothermal structure comprises a substrate having a groove formed on a surface thereof, an insulator layer formed on the surface of the substrate, the insulator layer having an extended portion extending over the groove, a heater formed on the extended portion, the heater converting the first electrical signal input from the input signal processing circuit to the temperature signal, and a sensor formed on the extended portion and separated from the heater, the sensor converting the temperature signal of the heater to the second electrical signal.

The audio frequency filter according to the third embodiment of the present invention comprises a first transconductance amplifier for receiving a first voltage signal and for converting the first voltage signal to a first current signal, an electrothermal structure for receiving the first current signal output from the first transconductance amplifier, converting the first current signal to a temperature signal, and converting the temperature signal to a second voltage signal, and a second transconductance amplifier for converting the second voltage signal to a second current signal, the second current signal being feedbacked to an input of the electrothermal structure.

Here, the electrothermal structure is the same as those used in the electrothermal integrator of the present invention.

The audio frequency filter according to a fourth embodiment of the present invention comprises a first transconductance amplifier receiving a first voltage signal and converting the first voltage signal to a first current signal, a first electrothermal structure for receiving the first current signal output from the first transconductance amplifier, converting the first current signal to a first temperature signal, and converting the first temperature signal to a second voltage signal, a first amplifier for amplifying the second voltage signal output from the first electrothermal structure, resulting in a third voltage signal, a second transconductance amplifier for converting the third voltage signal output from the first amplifier to a second current signal, the second current signal being feedbacked to an input of the first electrothermal structure, a third transconductance amplifier for receiving the third voltage signal output from the first amplifier and for converting the third voltage signal to a third current signal, a second electrothermal structure for receiving the third current signal output from the third transconductance amplifier, converting the third current signal to a second temperature signal, and converting the second temperature signal to a fourth voltage signal, a second amplifier for amplifying the fourth voltage signal output from the second electrothermal structure, and a fourth transconductance amplifier for converting the fourth voltage signal output from the second amplifier to a fourth current signal, the fourth current signal being added to the second current signal and feedbacked to the input of the first electrothermal structure.

Here, the first and second electrothermal structures are the same as those used in the electrothermal integrator of the present invention.

DESCRIPTION OF THE PREFERRED EMBODIMENT

The preferred embodiments of the present invention will be described hereinafter with reference to the attached drawings.

Figure 1:
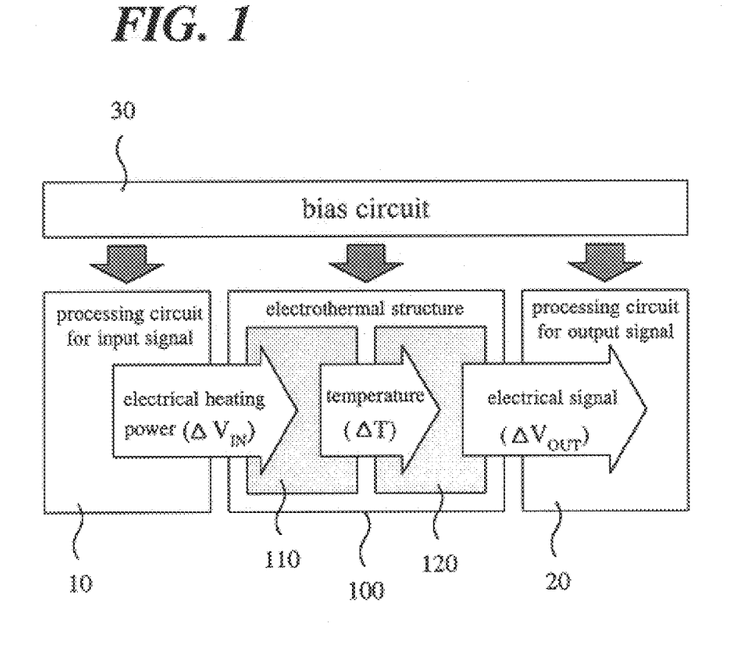
FIG. 1 is a conceptual diagram of an audio frequency filter according to the present invention.

FIG. 1 is a conceptual diagram of an audio frequency filter according to the present invention. Referring to FIG. 1, the audio frequency filter includes an electrothermal structure 100 for filtering high frequency electrical signals, an input signal processing circuit 10 for converting an electrical signal intended to be filtered to a proper input signal and inputting the input signal to the electrothermal structure 100, an output signal processing circuit 20 for converting the electrical signal output from the electrothermal structure 100 to a proper output signal, and a bias circuit 30 for supplying a bias voltage to each of the electrothermal structure 100, the input signal processing circuit 10, and the output signal processing circuit 20. The electrothermal structure 100 includes a heater 110 and a sensor 120.

The electrical signal input from the input signal processing circuit 10 to the electrothermal structure 100 generates heat in the heater 110, and the heat causes change in the resistance of the sensor 120. Thus, the voltage across the sensor 120 changes, and the output signal processing circuit 120 converts the change of voltage to an electrical signal and outputs it.

If the frequency of the electrical signal input from the input signal processing circuit 10 exceeds the unique thermal time constant of the electrothermal structure 100, the electrothermal structure 100 becomes incapable of temperature response, resulting in filtering of high frequency signals.

Figure 2:
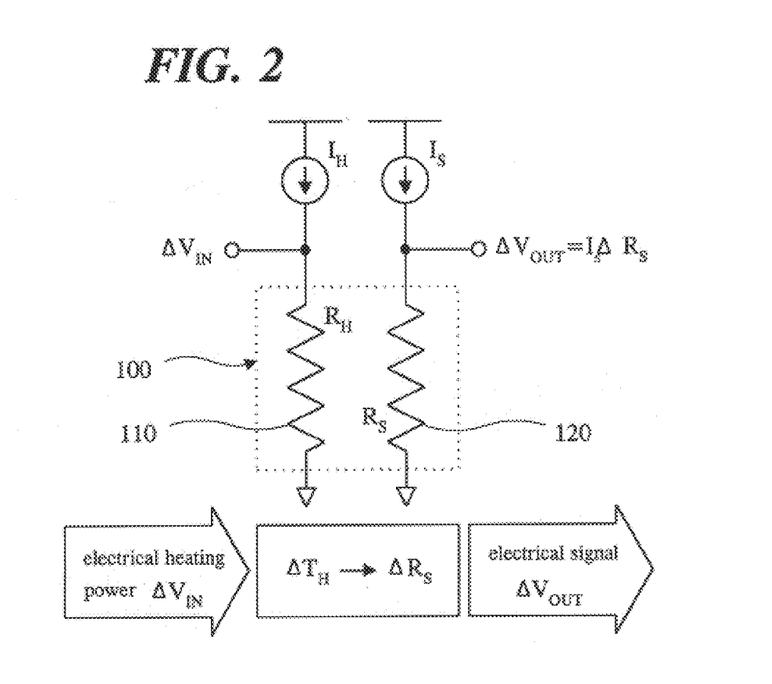
FIG. 2 is a circuit diagram for illustrating the electrothermal structure 100 shown in FIG. 1.

FIG. 2 is a circuit diagram for illustrating the electrothermal structure 100 shown in FIG. 1. Referring to FIG. 2 in association with FIG. 1, the bias circuit 30 causes bias currents $I_H$ and $I_S$ to flow through the heater 110 and the sensor 120. When the input signal $\Delta V_{IN}$ is input to the heater 110, the temperature of the heater 110, in response, rises. The change in temperature affects the sensor 120 by manifesting a change $\Delta R_S$ in the resistance of the sensor 120. Thus, an output voltage having a value $\Delta V_{OUT}$ ($=I_S \cdot \Delta R_S$) is output. The entire circuit shown in FIG. 2 will be referred to as the "basic block 200" hereinafter.

Figure 3A:
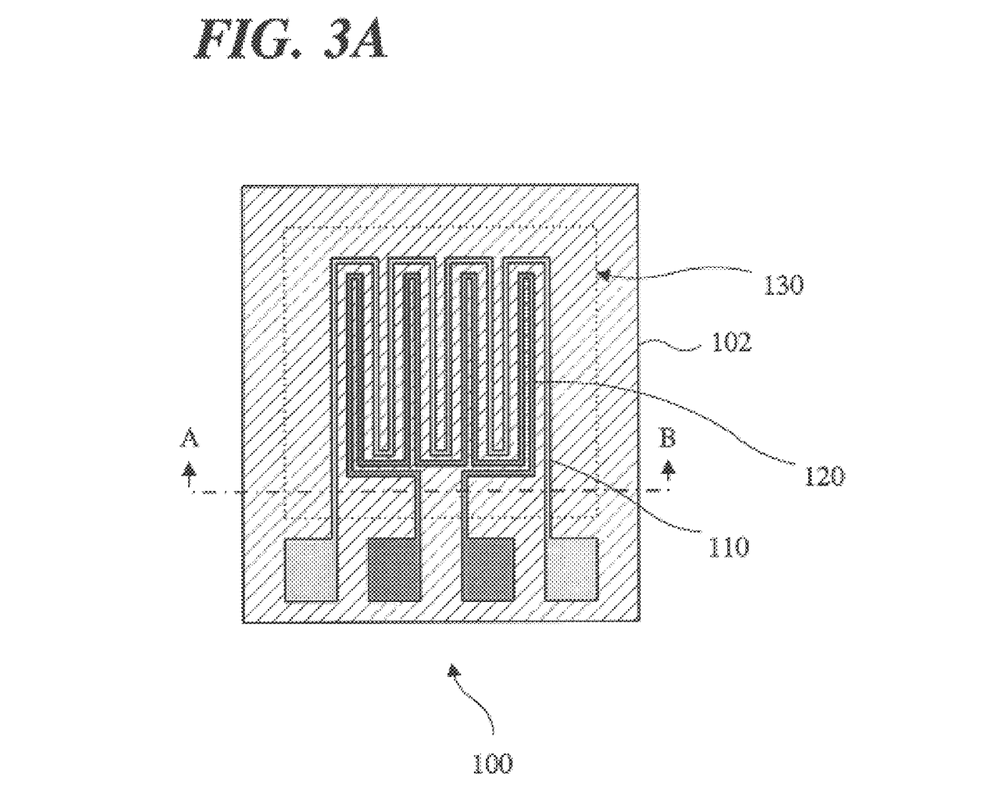
FIG. 3A and FIG. 3B Mare diagrams for illustrating an example of the electrothermal structure 100 shown in FIG. 1.
Figure 3B:
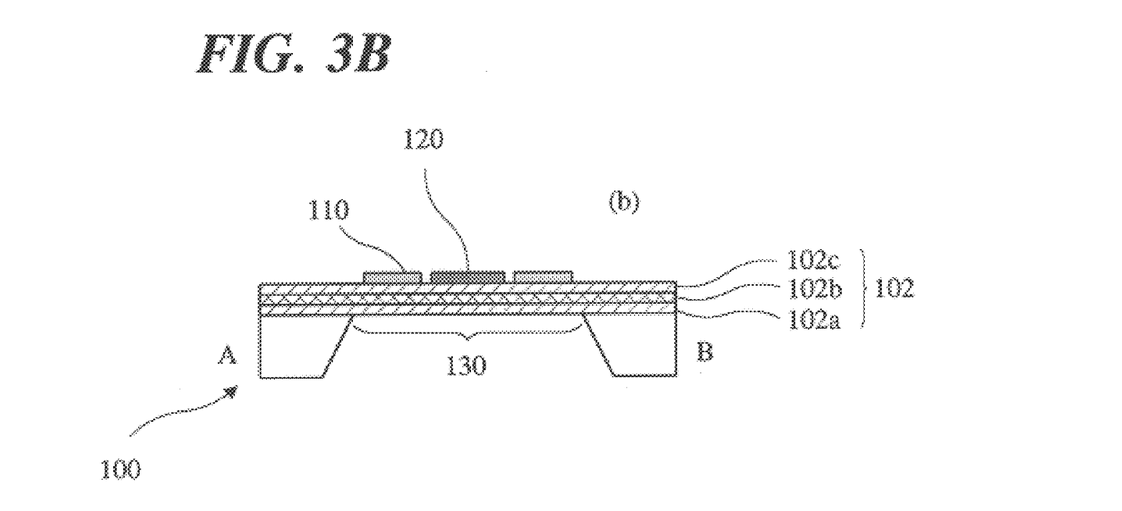

Because the electrothermal structure 100 is generally a distributed system, it is difficult to simply model it in the form of a general differential equation. In addition, the electrothermal structure 100 has to be fabricated using micro-machining technology in the form of a structure that can be approximated to a first degree differential equation, because it must be thermally isolated from other peripheral circuits. FIG. 3A and FIG. 3B show an example of such an electrothermal structure, wherein FIG. 3A is a plan view and FIG. 3B is a cross-sectional view along the line A-B in FIG. 3A.

Referring to FIG. 3A and FIG. 3B, the electrothermal structure 100 includes a silicon substrate 132 having an aperture, a thin insulator layer 102 formed on the silicon substrate 132 and covering the opening of the aperture, and a heater 110 and a sensor 120 which are both formed on the insulator layer 102 over the aperture and separated by a certain distance. The insulator layer 102 comprises a multilayer structure of a lower silicon oxide layer 102a, a silicon nitride layer 102b, and an upper silicon oxide layer 102c stacked sequentially.

There is no silicon substrate but only the thin insulator layer 102 under the heater 110 and the sensor 120. The part of the thin insulator layer 102 of which the bottom face is exposed by the aperture of the silicon substrate 132 will be hereinafter referred to as "diaphragm."

The method of fabricating the electrothermal structure 100 will be illustrated hereinafter.

First, the multi-layer insulator layer 102 comprised of the lower silicon oxide layer 102a, the silicon nitride layer 102b, and the upper silicon oxide layer 102c is formed on the silicon substrate 132. Subsequently, a metallic resistor layer is formed on the insulator layer 102, and is patterned by way of lift-off technique to form the heater 110 and the sensor 120. The metallic resistor layer is formed by sequentially stacking a titanium layer 100 Å thick and a nickel layer 400 Å thick. The titanium layer enhances the adhesive property between the nickel layer and the insulator layer 102.

Next, the back face of the substrate 132 is anisotropically etched to form the aperture until the part of the insulator layer 102 under the heater 110 and the sensor 120 is exposed, so that the diaphragm 130 is formed. As a result, there is no conductance of heat through the substrate 132, because there is no silicon substrate under the heater 110 and the sensor 120. Thus, the part of the electrothermal structure 100 where the heater 110 and the sensor 120 exist is thermally isolated from other peripheral circuits.

Figure 4:
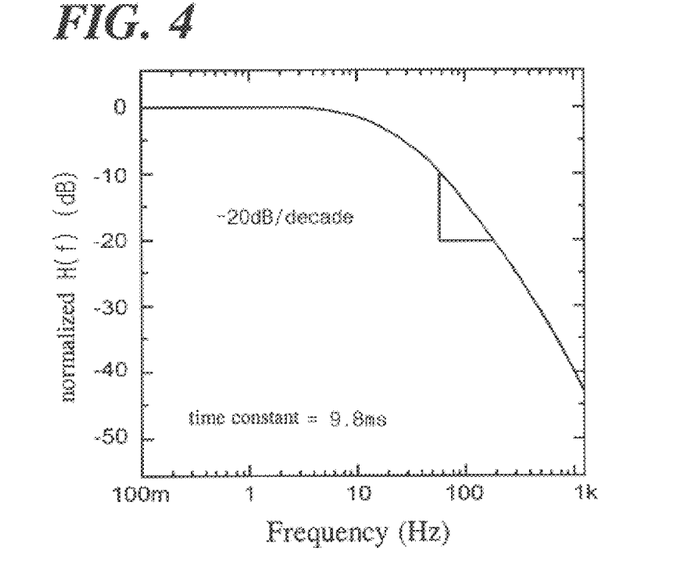
FIG. 4 is a graph of the frequency response of the filter shown in FIG. 1 utilizing the electrothermal structure 100 shown in FIG. 3.

When the filter of FIG. 1 is fabricated by employing the electrothermal structure 100 of FIG. 3, the ratio of $\Delta V_{OUT}$ to $\Delta V_{IN}$ with respect to frequency manifests the characteristics of a low-pass filter having one pole as shown in FIG. 4.

Figure 5A:
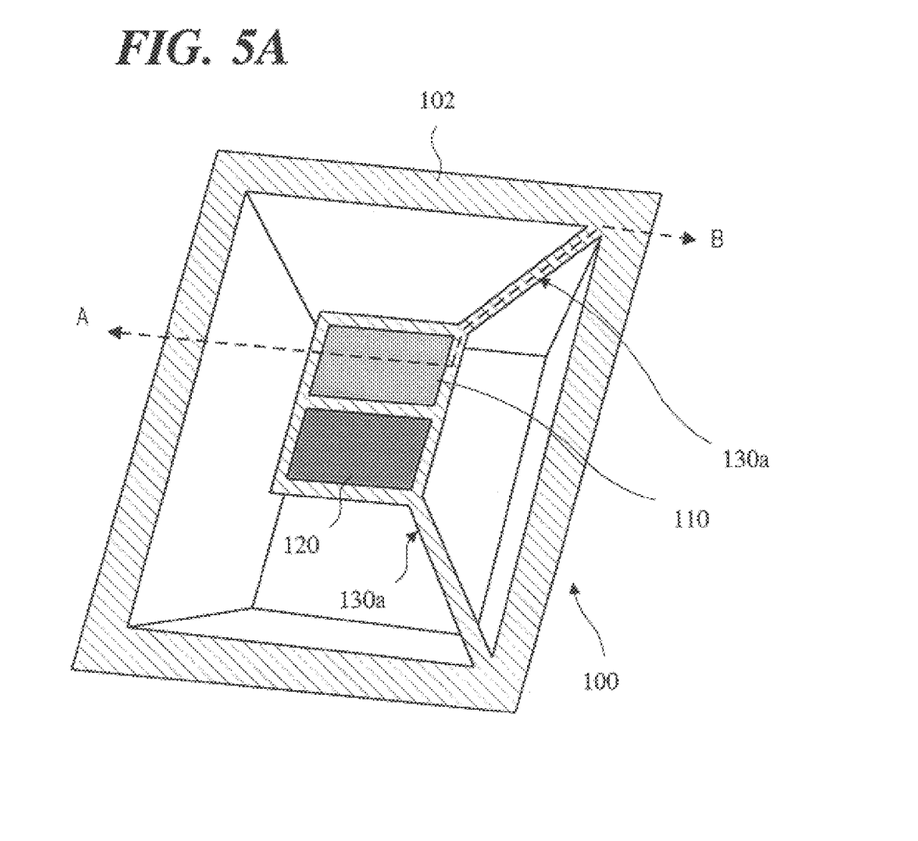
FIG. 5A and FIG. 5B are diagrams for illustrating another example of the electrothermal structure 100 shown in FIG. 1.
Figure 5B:
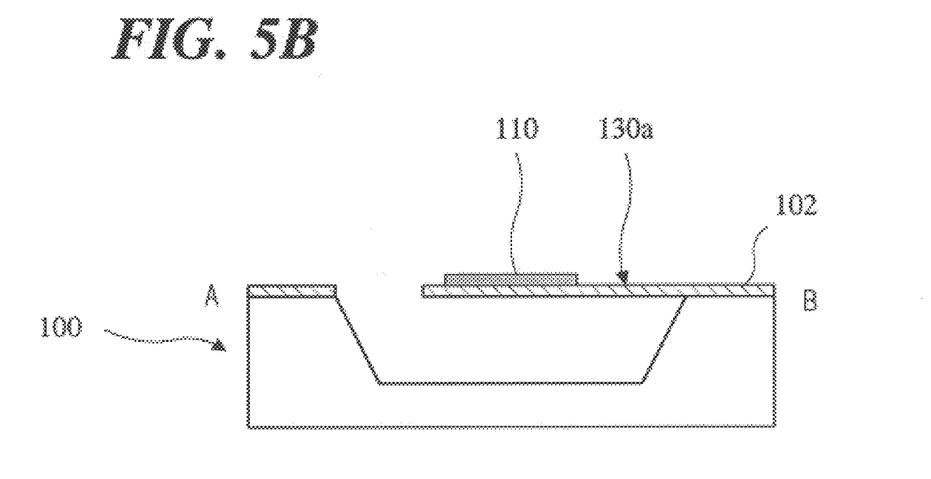

FIG. 5A and FIG. 5B are diagrams for illustrating another example of the electrothermal structure 100 shown in FIG. 1, wherein FIG. 5A is a plan view and FIG. 5B is a cross-sectional view along the line A-B in FIG. 5A. Same reference numerals as those in FIG. 3A and FIG. 3B represent the same element with the same function, and detailed explanation of those elements will be omitted.

Referring to FIG. 5A and FIG. 5B, a groove is formed on the silicon substrate 132, and an insulator layer 102 is formed on the surface of the silicon substrate 132. The insulator 102 is not formed on the side walls and bottom face of the groove. The insulator layer 102 has an extended part 130a extending toward the top of the groove, and the heater 110 and the sensor 120 are formed on the extended part 130a. An empty space exists under the part of the insulator layer 102 where the heater 110 and the sensor 120 are located.

The method of forming the electrothermal structure 100 shown in FIG. 5A and FIG. 5B is illustrated hereinafter.

First, the insulator layer 102 is formed on the silicon substrate 132, and the heater 110 and the sensor 120 are formed on the insulator layer 102. Subsequently, the insulator layer 102 is patterned such that the silicon layer 132 is exposed in the shape of a square ring and the inner part and the outer part of the ring are connected via a thin leg-like pattern. Subsequently, the silicon substrate 132 is etched by way of electrochemical etching such that a space is formed under the heater 110 and the sensor 120. As a result, the electrothermal structure 100 is completed.

Because there is no silicon substrate under the heater 110 and the sensor 120 as in FIG. 3, the heater 110 and the sensor 120 are thermally isolated from the peripheral circuits. The thermal response of such an electrothermal structure 100a can also be approximated to a first degree differential equation, and is suitable for the filter of FIG. 1.

Figure 6A:
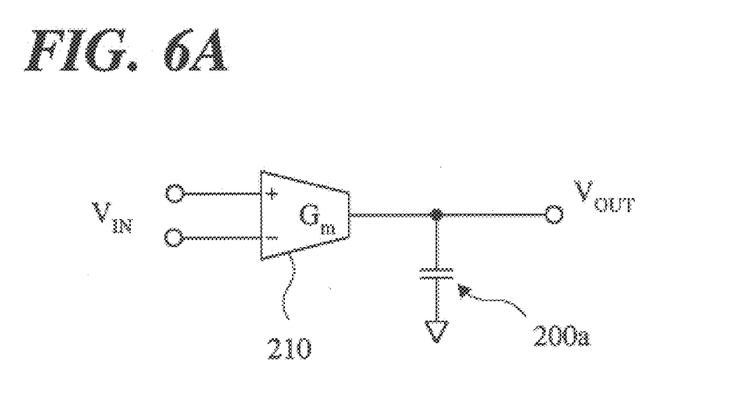
FIG. 6A is a block diagram of a typical Gm-C integrator.

FIG. 6A is a block diagram of a typical Gm-C integrator. Referring to FIG. 6A, the Gm-C integrator includes a transconductance amplifier 210 that converts the input voltage $V_{IN}$ to a current, and a capacitor 220a. The input voltage $V_{IN}$ is converted to a corresponding current by the transconductance amplifier 210, and the capacitor 220a is charged by this current. The voltage of the capacitor 220a is output via the output terminal as an output voltage $V_{OUT}$.

Figure 6B:
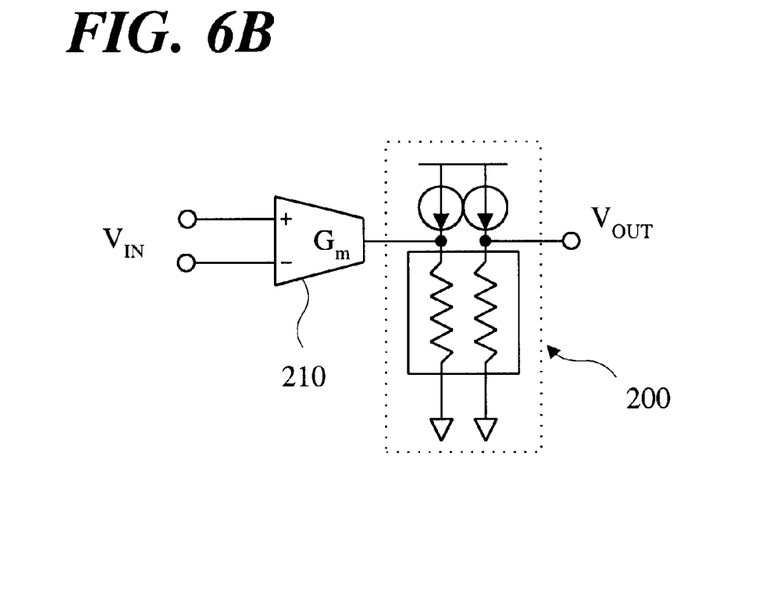
FIG. 6B is a block diagram of an electrothermal integrator according to the present invention.

FIG. 6B is a block diagram of an electrothermal integrator according to the present invention utilizing the basic block 200 of FIG. 2 instead of the electrical capacitor 220a. A thermal capacitor has a greater capacitance than an electrical capacitance. Thus, if a thermal capacitor is used instead of an electrical capacitor, it is still possible to filter high frequency signals arising from incapable temperature responses even though the basic block 200 is formed on a small area.

Referring to FIG. 6B, the input voltage $V_{IN}$ is converted to a corresponding current by the transconductance amplifier 210, and this current is supplied to the basic block 200. As illustrated with reference to FIG. 2, the input signal supplied to the basic block 200 is output as an output voltage $V_{OUT}$ after its high frequency components are filtered.

Figure 7A:
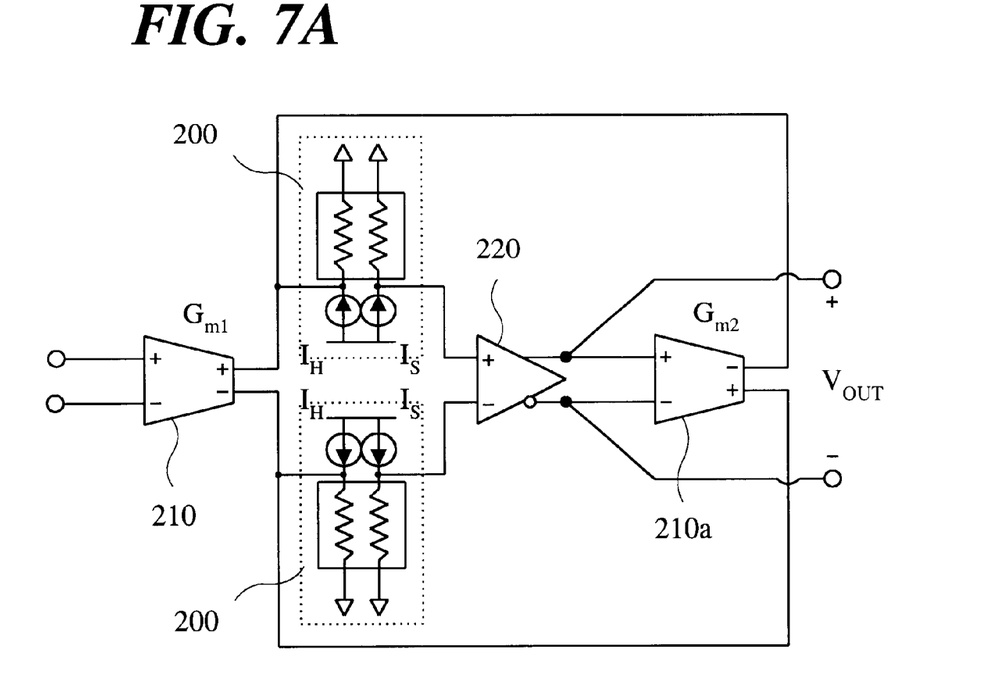
FIG. 7A is a diagram of a low-pass filter employing the electrothermal integrator shown in FIG. 6B.

FIG. 7A is a diagram of a first-order low-pass filter employing the electrothermal integrator shown in FIG. 6B. Referring to FIG. 7A, the input voltage $V_{IN}$ is converted to a current signal by the first transconductance amplifier 210. This current signal is input to the first basic block 200. The voltage signal output from the first basic block 200 is amplified and output as the output voltage $V_{OUT}$ by the amplifier 220. The output voltage $V_{OUT}$ is converted to a current signal by the second transconductance amplifier 210a and is feedbacked as an input signal to the basic block 200.

Figure 7B:
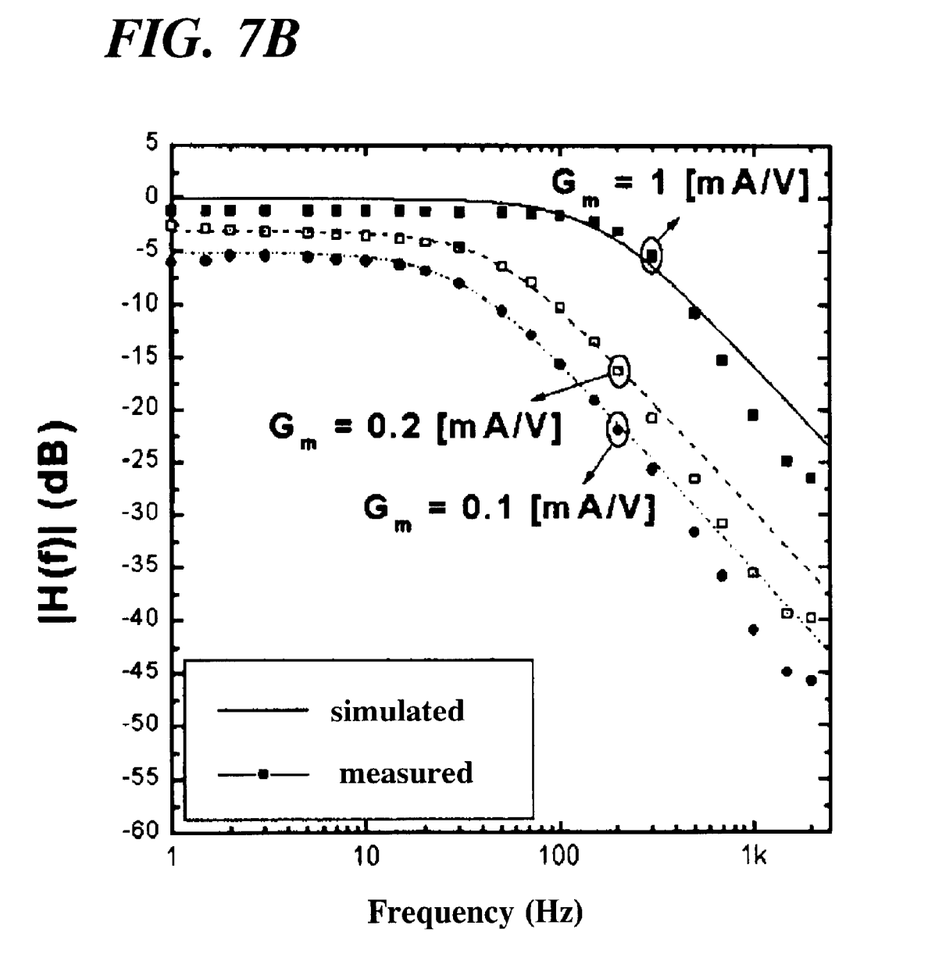
FIG. 7B is a graph of the frequency response of the low-pass filter shown in FIG. 7A.

FIG. 7B is a graph of the frequency response of the low-pass filter shown in FIG. 7A. The characteristic frequency of the filter can be adjusted by properly adjusting the transconductance of the transconductance amplifiers 210 and 210a, the gain of the amplifier 220, and the bias currents $I_H$ and $I_S$. That is, the characteristic frequency can be controlled electrically.

Figure 8A:
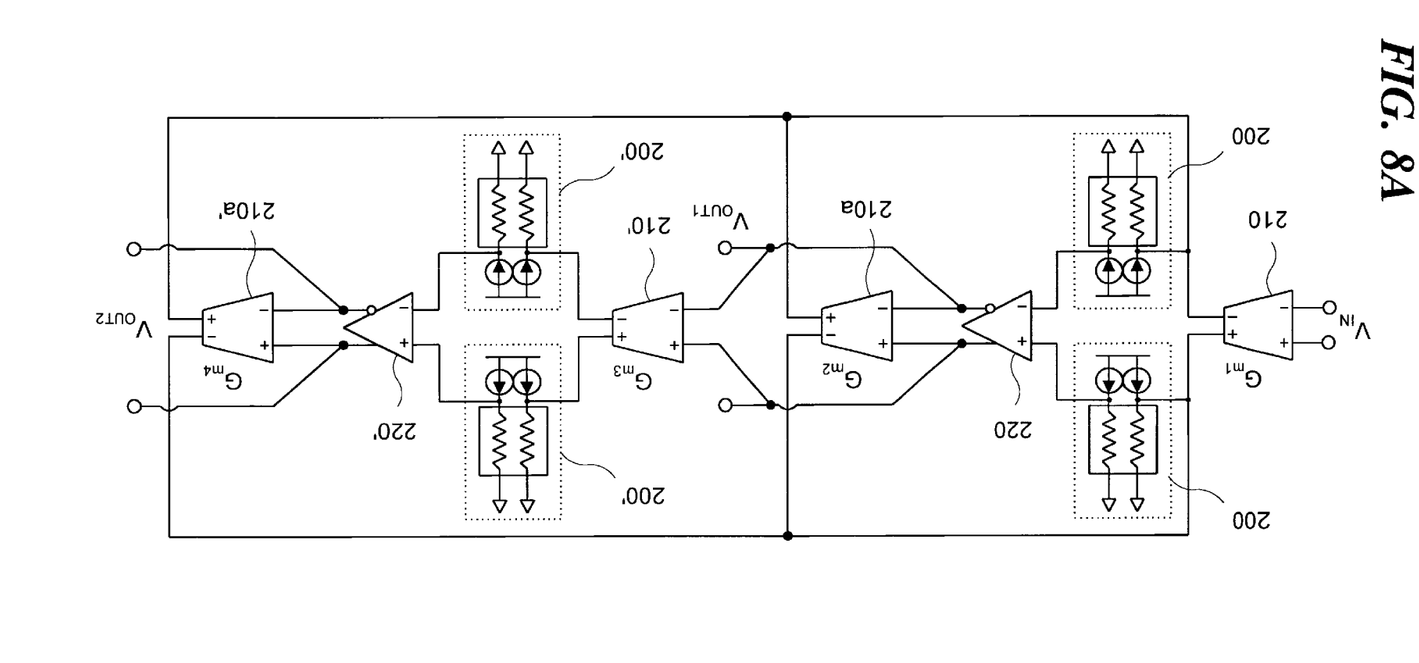
FIG. 8A is a diagram of a band-pass filter employing the electrothermal integrator shown in FIG. 6B.

FIG. 8A is a diagram of a second-order band-pass filter employing the electrothermal integrator shown in FIG. 6B. Referring to FIG. 8A, the input voltage $V_{IN}$ is converted to a current signal by the first transconductance amplifier 210. This current signal is input to the first basic block 200. The voltage signal output from the first basic block 200 is amplified and output as the output voltage $V_{OUT1}$ by the first amplifier 220. The output voltage $V_{OUT1}$ is converted to a current signal by the second transconductance amplifier 210a and is feedbacked as an input signal to the basic block 200.

The output voltage $V_{OUT1}$ is converted to a current signal by the third transconductance amplifier 210'. This current signal is input to the second basic block 200'. The voltage signal output from the second basic block 200' is amplified and output as the output voltage $V_{OUT2}$ by the second amplifier 220'. The output voltage $V_{OUT2}$ is converted to a current signal by the fourth transconductance amplifier 210a', and this current signal is added to the current signal output from the second transconductance amplifier 210a to be feedbacked as an input signal to the basic block 200.

Figure 8B:
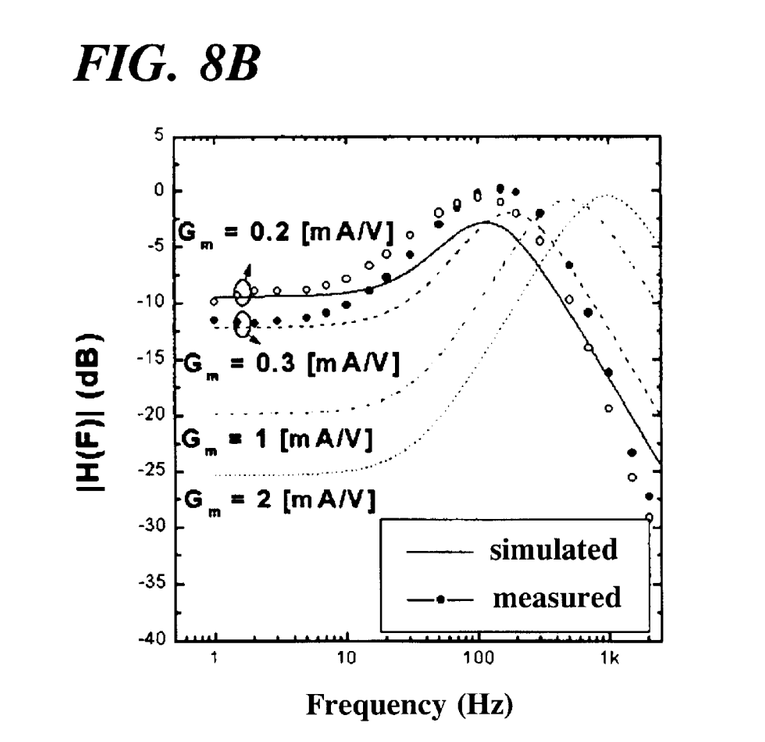
FIG. 8B is a graph of the frequency response of the band-pass filter shown in FIG. 8A.

FIG. 8B is a graph of the frequency response of the band-pass filter shown in FIG. 8A. The frequency response was measured at the output terminal of $V_{OUT1}$. As shown in the graph, the filter has the characteristics of a band-pass filter.

Figure 9:
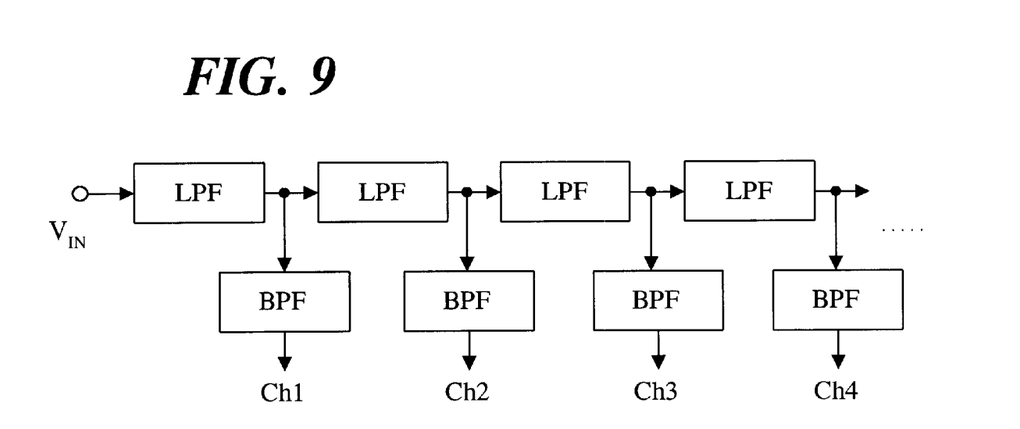
FIG. 9 is a filter bank comprised of the low-pass filter of FIG. 7A and the band-pass filter of FIG. 8A.

FIG. 9 is a filter bank comprised of the low-pass filter of FIG. 7A and the band-pass filter of FIG. 8A. The filter bank comprises a plurality of low-pass filters that are connected such that the output signal of one low-pass filter becomes the input signal of another low-pass filter. The output signal of each of the low-pass filters is filtered by each of a plurality of band-pass filters. This kind of filter bank can be used to analyze the frequency characteristics of voice signals in voice recognition systems.

The audio frequency filter of the present invention has an advantage that the area required for the filter and power consumption can be reduced by using the electrothermal structure to form the basic block of the filter. In addition, a variety of filters with characteristic frequencies which are electrically adjustable can be formed on one chip. Moreover, an integrated filter bank can be formed using such filters.

Generally, thermal response is slower than electrical response. Thus, an audio frequency filter can be fabricated by properly integrating electrothermal structures and electrical circuitry.

Although the present invention has been illustrated with reference to embodiments of the present invention, various modifications are possible within the scope of the present invention by a person skilled in the art. Therefore, the scope of the present invention should be defined not by the illustrated embodiments but by the attached claims.

What is claimed is:

1. An electrothermal integrator comprising:
    a transconductance amplifier for receiving a first voltage signal and converting the first voltage signal to a current signal; and
    an electrothermal structure for receiving the current signal output from the transconductance amplifier, converting the current signal to a temperature signal, and converting the temperature signal to a second voltage signal.

2. The electrothermal integrator as claimed in claim 1, wherein the electrothermal structure comprises:
    a substrate having an aperture formed thereon;
    an insulator layer formed on the substrate and covering an opening of the aperture;
    a heater formed on the insulator layer over the opening of the aperture, the heater converting the current signal input from the transconductance amplifier to the temperature signal; and
    a sensor formed on the insulator layer over the opening of the aperture and separated from the heater, the sensor converting the temperature signal of the heater to the second voltage signal.

3. The electrothermal integrator as claimed in claim 1, wherein the electrothermal structure comprises:
    a substrate having a groove formed on a surface thereof,
    an insulator layer formed on the surface of the substrate, the insulator layer having an extended portion extending over the groove;
    a heater formed on the extended portion, the heater converting the current signal input from the transconductance amplifier to the temperature signal; and
    a sensor formed on the extended portion and separated from the heater, the sensor converting the temperature signal of the heater to the second voltage signal.

4. An audio frequency filter having an electrothermal structure for converting a first electrical signal received as an input signal to a temperature signal and for converting the temperature signal to a second electrical signal, an input signal processing circuit for inputting the first electrical signal to the electrothermal structure, and an output signal processing circuit for outputting the second electrical signal converted by the electrothermal structure, wherein the electrothermal structure comprises:
    a substrate having an aperture formed thereon;
    an insulator layer formed on the substrate and covering an opening of the aperture;
    a heater formed on the insulator layer over the opening of the aperture, the heater converting the first electrical signal input from the input signal processing circuit to the temperature signal; and
    a sensor formed on the insulator layer over the opening of the aperture and separated from the heater, the sensor converting the temperature signal of the heater to the second electrical signal.

5. An audio frequency filter having an electrothermal structure for converting a first electrical signal received as an input signal to a temperature signal and for converting the temperature signal to a second electrical signal, an input signal processing circuit for inputting the first electrical signal to the electrothermal structure, and an output signal processing circuit for outputting the second electrical signal converted by the electrothermal structure, wherein the electrothermal structure comprises:
    a substrate having a groove formed on a surface thereof;
    an insulator layer formed on the surface of the substrate, the insulator layer having an extended portion extending over the groove;
    a heater formed on the extended portion, the heater converting the first electrical signal input from the input signal processing circuit to the temperature signal; and
    a sensor formed on the extended portion and separated from the heater, the sensor converting the temperature signal of the heater to the second electrical signal.

6. An audio frequency filter comprising:
    a first transconductance amplifier for receiving a first voltage signal and for converting the first voltage signal to a first current signal;
    an electrothermal structure for receiving the first current signal output from the first transconductance amplifier, converting the first current signal to a temperature signal, and converting the temperature signal to a second voltage signal; and
    a second transconductance amplifier for converting the second voltage signal to a second current signal, the second current signal being feedbacked to an input of the electrothermal structure.

7. The audio frequency filter as claimed in claim 6, wherein the electrothermal structure comprises:
    a substrate having an aperture formed thereon;
    an insulator layer formed on the substrate and covering an opening of the aperture;
    a heater formed on the insulator layer over the opening of the aperture, the heater converting the first current signal input from the first transconductance amplifier to the temperature signal; and
    a sensor formed on the insulator layer over the opening of the aperture and separated from the heater, the sensor converting the temperature signal of the heater to the second voltage signal.

8. The audio frequency filter as claimed in claim 6, wherein the electrothermal structure comprises:
    a substrate having a groove formed on a surface thereof;
    an insulator layer formed on the surface of the substrate, the insulator layer having an extended portion extending over the groove;
    a heater formed on the extended portion, the heater converting the first current signal input from the transconductance amplifier to the temperature signal; and
    a sensor formed on the extended portion and separated from the heater, the sensor converting the temperature signal to the second voltage signal.

9. An audio frequency filter comprising:
    a first transconductance amplifier receiving a first voltage signal and converting the first voltage signal to a first current signal;

a first electrothermal structure for receiving the first current signal output from the first transconductance amplifier, converting the first current signal to a first temperature signal, and converting the first temperature signal to a second voltage signal;

a first amplifier for amplifying the second voltage signal output from the first electrothermal structure, resulting in a third voltage signal;

a second transconductance amplifier for converting the third voltage signal output from the first amplifier to a second current signal, the second current signal being feedbacked to an input of the first electrothermal structure;

a third transconductance amplifier for receiving the third voltage signal output from the first amplifier and for converting the third voltage signal to a third current signal;

a second electrothermal structure for receiving the third current signal output from the third transconductance amplifier, converting the third current signal to a second temperature signal, and converting the second temperature signal to a fourth voltage signal;

a second amplifier for amplifying the fourth voltage signal output from the second electrothermal structure; and a fourth transconductance amplifier for converting the fourth voltage signal output from the second amplifier to a fourth current signal, the fourth current signal being added to the second current signal and feedbacked to the input of the first electrothermal structure.

10. The audio frequency filter as claimed in claim 9, wherein each of the first and second electrothermal structures comprises:

a substrate having an aperture formed thereon;

an insulator layer formed on the substrate and covering an opening of the aperture;

a heater formed on the insulator layer over the opening of the aperture, the heater converting an input current signal to a temperature signal; and a sensor formed on the insulator layer over the opening of the aperture and separated from the heater, the sensor converting the temperature signal of the heater to a voltage signal.

11. The audio frequency filter as claimed in claim 9, wherein each of the first and second electrothermal structures comprises:

a substrate having a groove formed on a surface thereof;

an insulator layer formed on the surface of the substrate, the insulator layer having an extended portion extending over the groove;

a heater formed on the extended portion, the heater converting an input current signal to a temperature signal; and a sensor formed on the extended portion and separated from the heater, the sensor converting the temperature signal of the heater to a voltage signal.

* * * * *